(12) United States Patent
Lee et al.

(10) Patent No.: US 12,075,659 B2
(45) Date of Patent: Aug. 27, 2024

(54) DISPLAY APPARATUS AND METHOD OF MANUFACTURING THE SAME

(71) Applicant: Samsung Display Co., Ltd., Yongin-si (KR)

(72) Inventors: Jungan Lee, Yongin-si (KR); Gwanggeun Lee, Yongin-si (KR); Taehui Kim, Yongin-si (KR); Jeongju Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 221 days.

(21) Appl. No.: 17/505,549

(22) Filed: Oct. 19, 2021

(65) Prior Publication Data

US 2022/0123078 A1 Apr. 21, 2022

(30) Foreign Application Priority Data

Oct. 20, 2020 (KR) .................. 10-2020-0135808

(51) Int. Cl.
*H01L 27/32* (2006.01)
*H01L 27/12* (2006.01)
(Continued)

(52) U.S. Cl.
CPC ......... *H10K 59/123* (2023.02); *H01L 27/124* (2013.01); *H01L 27/1248* (2013.01);
(Continued)

(58) Field of Classification Search
CPC .......... H10K 50/80–818; H10K 59/00; H10K 59/1213; H10K 59/131;
(Continued)

(56) References Cited

U.S. PATENT DOCUMENTS 7,192,334 B2 * 3/2007 Hashimoto ............ H10K 50/80
 445/24
7,994,710 B2 8/2011 Jeon et al.
(Continued)

FOREIGN PATENT DOCUMENTS

KR 10-0959107 5/2010
KR 10-1182442 9/2012
(Continued)

*Primary Examiner* — Victoria K. Hall
(74) *Attorney, Agent, or Firm* — KILE PARK REED & HOUTTEMAN PLLC

(57) ABSTRACT

A display apparatus includes: a substrate; a source electrode, a drain electrode, and first electrodes disposed on the substrate and spaced apart from each other; a first layer covering the source electrode, the drain electrode, and the first electrodes; a semiconductor layer disposed on the first layer; a source connection electrode contacting the source electrode through a first hole in the first layer to electrically connect the source electrode and the semiconductor layer to each other; a drain connection electrode contacting the drain electrode through a second hole in the first layer to electrically connect the drain electrode and the semiconductor layer to each other; and a pixel electrode disposed above the first layer and overlapping the first electrodes including first projections overlapping the first electrodes and first recesses between the first projections.

19 Claims, 10 Drawing Sheets

(51) Int. Cl.
*H01L 29/417* (2006.01)
*H01L 29/786* (2006.01)
*H01L 51/52* (2006.01)
*H01L 51/56* (2006.01)
*H10K 50/813* (2023.01)
*H10K 59/123* (2023.01)
*H10K 59/131* (2023.01)
*H10K 59/88* (2023.01)
*H10K 71/00* (2023.01)
*H10K 50/844* (2023.01)
*H10K 59/12* (2023.01)
*H10K 59/121* (2023.01)
*H10K 59/38* (2023.01)

(52) U.S. Cl.
CPC .... *H01L 27/1259* (2013.01); *H01L 29/41733* (2013.01); *H01L 29/78633* (2013.01); *H10K 50/813* (2023.02); *H10K 59/131* (2023.02); *H10K 59/88* (2023.02); *H10K 71/00* (2023.02); *H10K 50/844* (2023.02); *H10K 59/1201* (2023.02); *H10K 59/1213* (2023.02); *H10K 59/38* (2023.02)

(58) Field of Classification Search
CPC ...... H10K 59/805–80517; H10K 59/88; H01L 27/124; H01L 29/41733
See application file for complete search history.

(56) References Cited

U.S. PATENT DOCUMENTS

| | | | |
|---|---|---|---|
| 8,471,275 B2 | 6/2013 | Lee et al. | |
| 9,064,825 B2 | 6/2015 | Kim | |
| 9,653,652 B2 | 5/2017 | Shin et al. | |
| 2006/0009133 A1* | 1/2006 | Hashimoto | H10K 59/122 451/29 |
| 2009/0096949 A1* | 4/2009 | Cho | H10K 59/1213 257/40 |
| 2011/0006290 A1* | 1/2011 | Noh | H10K 59/1213 438/34 |
| 2014/0138642 A1* | 5/2014 | Kim | H10K 50/813 438/34 |
| 2015/0263235 A1* | 9/2015 | Shin | H10K 50/80 257/72 |
| 2021/0098557 A1* | 4/2021 | Lee | H10K 59/88 |
| 2021/0242291 A1* | 8/2021 | Jeon | H10K 59/131 |
| 2021/0359065 A1* | 11/2021 | Jeon | H10K 59/123 |
| 2022/0336669 A1* | 10/2022 | Bang | H01L 29/66969 |

FOREIGN PATENT DOCUMENTS

| | | |
|---|---|---|
| KR | 10-2015-0108478 | 9/2015 |
| KR | 10-2036326 | 10/2019 |

\* cited by examiner

DISPLAY APPARATUS AND METHOD OF MANUFACTURING THE SAME

CROSS-REFERENCE TO RELATED APPLICATION

This application claims priority from and the benefit of Korean Patent Application No. 10-2020-0135808, filed on Oct. 20, 2020, which is hereby incorporated by reference for all purposes as if fully set forth herein.

BACKGROUND

Field

Embodiments of the invention relate generally to a display apparatus and a method of manufacturing the display apparatus, and more particularly, to a display apparatus with improved process and emission efficiency, and a method of manufacturing the display apparatus.

Discussion of the Background

Organic light-emitting display apparatus have attracted attention as a next-generation display apparatus because it has advantages of wide viewing angles, excellent contrast, and fast response times.

The organic light-emitting display apparatus includes thin-film transistors and organic light-emitting diodes on a substrate, and the organic light-emitting diodes emit light by themselves. Such an organic light-emitting display apparatus may be used as a display unit in a small product such as a mobile phone or may be used as a display unit in a large product such as a television.

The display apparatus includes driving thin-film transistors, capacitors, and the like. Here, the thin-film transistor may include a semiconductor layer including a channel area, a source area, and a drain area, and a gate electrode electrically insulated from the semiconductor layer by a gate insulating layer.

The above information disclosed in this Background section is only for understanding of the background of the inventive concepts, and, therefore, it may contain information that does not constitute prior art.

SUMMARY

Display apparatus constructed according to principles and illustrative implementations of the invention and methods of manufacturing the same are capable of improving emission efficiency of the display, as well as process efficiency. For example, the display apparatus may include electrodes disposed in a pattern to allow a pixel electrode to have an uneven part such that the pixel may have improved emission efficiency. The patterned electrodes and the pixel electrode have structures that can be formed through minimized and/or reduced mask processes, and thus the display apparatus may have improved process efficiency.

Additional features of the inventive concepts will be set forth in the description which follows, and in part will be apparent from the description, or may be learned by practice of the inventive concepts.

According to one aspect of the invention, a display apparatus includes: a substrate; a source electrode, a drain electrode, and first electrodes disposed on the substrate and spaced apart from each other; a first layer covering the source electrode, the drain electrode, and the first electrodes; a semiconductor layer disposed on the first layer; a source connection electrode contacting the source electrode through a first hole in the first layer to electrically connect the source electrode and the semiconductor layer to each other; a drain connection electrode contacting the drain electrode through a second hole in the first layer to electrically connect the drain electrode and the semiconductor layer to each other; and a pixel electrode disposed above the first layer and overlapping the first electrodes including first projections overlapping the first electrodes and first recesses between the first projections.

The first layer may include third projections overlapping the first electrodes and third recesses between the third projections.

The display apparatus may further include: a first inorganic insulating layer disposed on the semiconductor layer; and a gate electrode disposed on the first inorganic insulating layer.

The display apparatus may further include a first additional inorganic insulating layer disposed between the first layer and the pixel electrode and including second projections overlapping the first electrodes and second recesses between the second projections.

The first inorganic insulating layer and the first additional inorganic insulating layer may include the same material, the first layer may include a buffer layer, the first electrodes may include pattern electrodes, the first and second projections may include first and second convex portions, and the first and second recesses may include first and second concave portions.

The pixel electrode and the gate electrode may include the same material.

The source connection electrode, the drain connection electrode, and the gate electrode may include the same material.

The display apparatus may further include a second inorganic insulating layer covering the source connection electrode, the drain connection electrode, and the gate electrode, and including an opening that exposes at least a portion of the pixel electrode.

The first electrodes, the source electrode, and the drain electrode may be disposed in the same layer and include the same material.

The display apparatus may further include a bottom metal layer disposed on the substrate and overlapping the semiconductor layer.

The bottom metal layer, the source electrode, the drain electrode, and the first electrodes may include the same material.

The first layer may cover the bottom metal layer, the source electrode, the drain electrode, and the first electrodes.

The display apparatus may further include: an intermediate layer disposed on the pixel electrode and including an emission layer; and an opposite electrode disposed on the intermediate layer.

According to another aspect of the invention, a method of manufacturing a display apparatus includes steps of: forming a first conductive layer on a substrate; patterning the first conductive layer to form a source electrode, a drain electrode, and first electrodes; forming a first layer that covers the source electrode, the drain electrode, and the first electrodes; forming a semiconductor layer on the first layer; forming a first inorganic insulating layer that covers the first layer and at least a portion of the semiconductor layer; forming, in the first layer and the first inorganic insulating layer, a first hole that exposes an upper surface of the source electrode and a second hole that exposes an upper surface of the drain electrode; forming a second conductive layer to cover the first inorganic insulating layer; patterning the second conductive layer to form a gate electrode overlapping the semiconductor layer, a source connection electrode overlapping the first hole, a drain connection electrode overlapping the second hole, and a pixel electrode overlapping the first electrodes; and sequentially forming a second inorganic insulating layer and a pixel-defining layer to cover the gate electrode, the source connection electrode, the drain connection electrode, and the pixel electrode; and forming, in the second inorganic insulating layer and the pixel-defining layer, an opening that exposes at least a portion of the pixel electrode.

The first electrodes may include pattern electrodes spaced apart from each other on the substrate, and the pixel electrode may include first projections overlapping the pattern electrodes and first recesses between the first projections.

The first electrodes may include pattern electrodes spaced apart from each other on the substrate, and the first layer may include third projections overlapping the pattern electrodes and third recesses between the third projections.

The source connection electrode may contact the source electrode through the first hole in the first layer to electrically connect the source electrode and the semiconductor layer to each other, and the drain connection electrode may contact the drain electrode through the second hole in the first layer to electrically connect the drain electrode and the semiconductor layer to each other.

The step of patterning the first conductive layer may include patterning the first conductive layer to form a bottom metal layer, the source electrode, the drain electrode, and the first electrodes, the bottom metal layer overlapping the semiconductor layer.

The first layer may cover the bottom metal layer, the source electrode, the drain electrode, and the first electrodes.

The method may further include steps of: forming an intermediate layer including an emission layer on the pixel electrode; and forming an opposite electrode on the intermediate layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
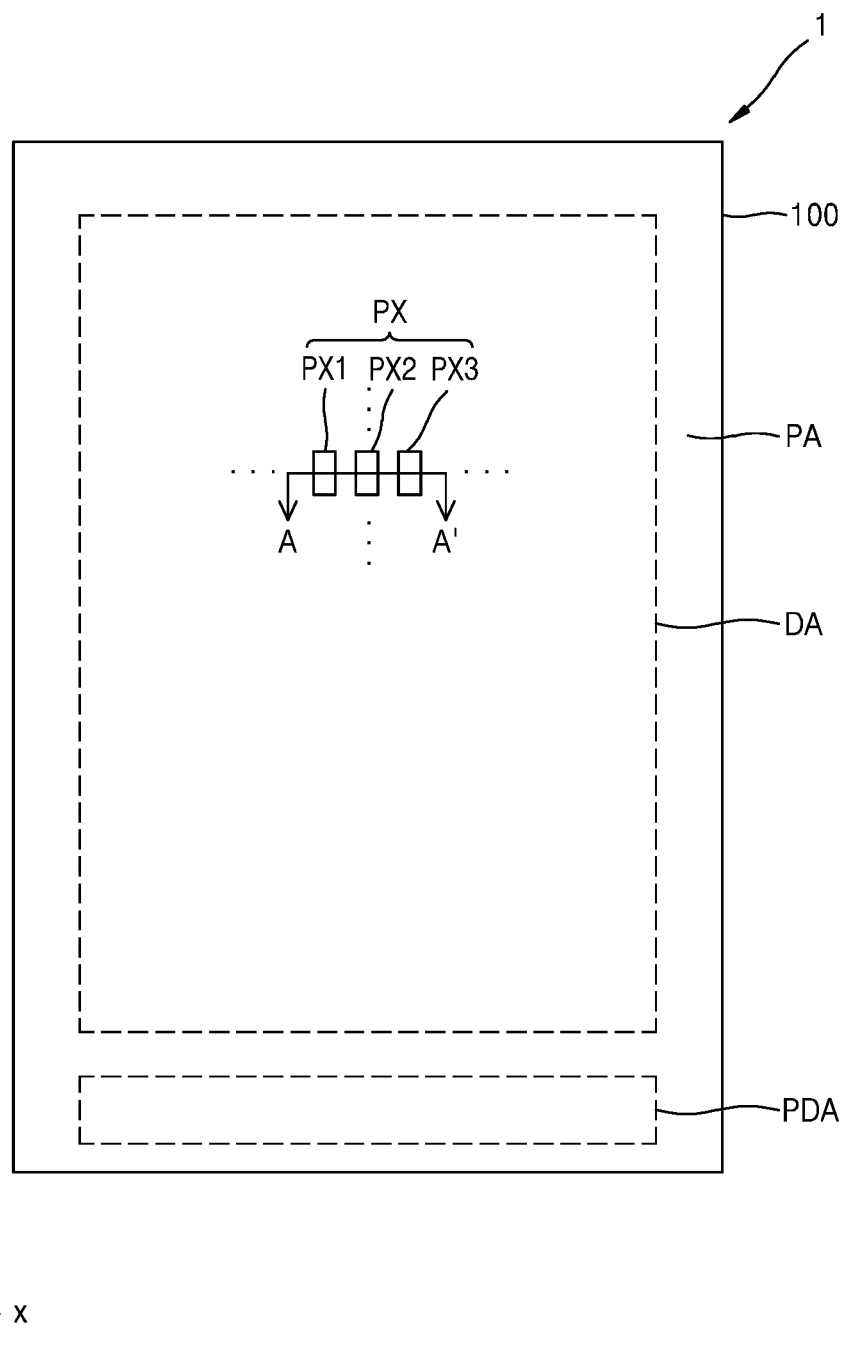
FIG. 1 is a plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display apparatus constructed according to the principles of the invention.

Referring to FIG. 1, the display apparatus 1 may include a display area DA that emits light and a peripheral area PA that does not emit light. A lower substrate 100 (see FIG. 3) may include a first area corresponding to the display area DA and a second area corresponding to the peripheral area PA.

While FIG. 1 illustrates that the display area DA of the display apparatus 1 has a generally rectangular shape, the display area DA may have various shapes such as a generally circular shape, a generally oval shape, a generally polygonal shape, a combination of such shapes, or the like.

Pixels PX may be located in the display area DA at a point where a scan line extending in a y-axis direction and a data line extending in an x-axis direction intersect with each other. Each pixel PX may include a pixel circuit PC (see FIG. 2) connected to the scan line and the data line, and a display element connected to the pixel circuit PC.

The peripheral area PA may surround at least a portion of the display area DA. For example, the peripheral area PA may entirely surround the display area DA. Various lines for transmitting electrical signals to be applied to the display area DA may be located in the peripheral area PA. In addition, a portion of a circuit unit for controlling an electrical signal applied to the display area DA may be located in the peripheral area PA.

The peripheral area PA may include a pad area PDA on at least one side thereof. A pad portion including a plurality of pads may be arranged in the pad area PDA. The plurality of pads included in the pad portion may be electrically connected to pads of a printed circuit board, respectively, and may thus receive a signal input via the printed circuit board. To this end, the pad portion may include the plurality of pads. The plurality of pads may be exposed, without being covered by an insulating layer, to be electrically connected to the printed circuit board or the like.

In other embodiments, the display apparatus 1 may include a component located on one side thereof. The component may include one or more electronic elements that use light or sound. The electronic elements may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound as some examples.

Hereinafter, an organic light-emitting display apparatus will be described as an example of the display apparatus 1. However, embodiments of the display apparatus are not limited thereto. For example, the display apparatus 1 may bean inorganic light-emitting display apparatus and/or a quantum dot light-emitting display apparatus. For example, an emission layer of a display element included in the display apparatus 1 may include an organic material or an inorganic material. As another example, the display apparatus 1 may include quantum dots, or organic materials and quantum dots, or inorganic materials and quantum dots.

Figure 2:
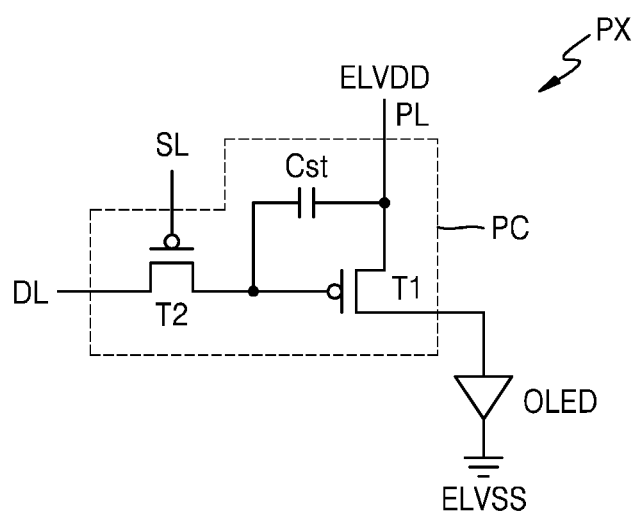
FIG. 2 is an equivalent circuit diagram of an embodiment of a representative one of the pixels of FIG. 1.

FIG. 2 is an equivalent circuit diagram of an embodiment of a representative one of the pixels of FIG. 1.

Referring to FIG. 2, each of the pixels PX may be electrically connected to a pixel circuit PC. The pixel circuit PC may include one or more thin-film transistors TFT (see FIG. 4) and one or more storage capacitors Cst. In an embodiment, the pixel circuit PC may include a first thin-film transistor T1, a second thin-film transistor T2, and the storage capacitor Cst. Each pixel PX may emit light from a display element. For example, the display element may include an organic light-emitting diode OLED.

The second thin-film transistor T2 herein also referred to as a switching thin-film transistor may be connected to a scan line SL and a data line DL and may transfer a data voltage received via the data line DL to the first thin-film transistor T1 based on a switching voltage received via the scan line SL. The storage capacitor Cst is connected to the second thin-film transistor T2, and a driving voltage line PL and may store a voltage corresponding to a voltage difference between a voltage received via the second thin-film transistor T2 and a first power voltage ELVDD applied to the driving voltage line PL.

The first thin-film transistor T1 herein also referred to as a driving thin-film transistor is connected to the driving voltage line PL and the storage capacitor Cst and may control a driving current flowing from the driving voltage line PL to the display element in response to a voltage stored in the storage capacitor Cst. The display element may emit light having a luminance according to the driving current. An opposite electrode (e.g., a cathode) of the display element may receive a second power voltage ELVSS.

In FIG. 2, the pixel circuit PC includes two thin-film transistors and one storage capacitor, but is not limited thereto. In other words, the number of thin-film transistors and/or the number of storage capacitors may vary according to the design of the pixel circuit PC. For example, the pixel circuit PC may further include four, five, or more thin-film transistors in addition to the above-described two thin-film transistors. In addition, the pixel circuit PC may further include one or more capacitors in addition to the above-described storage capacitor Cst.

Figure 3:
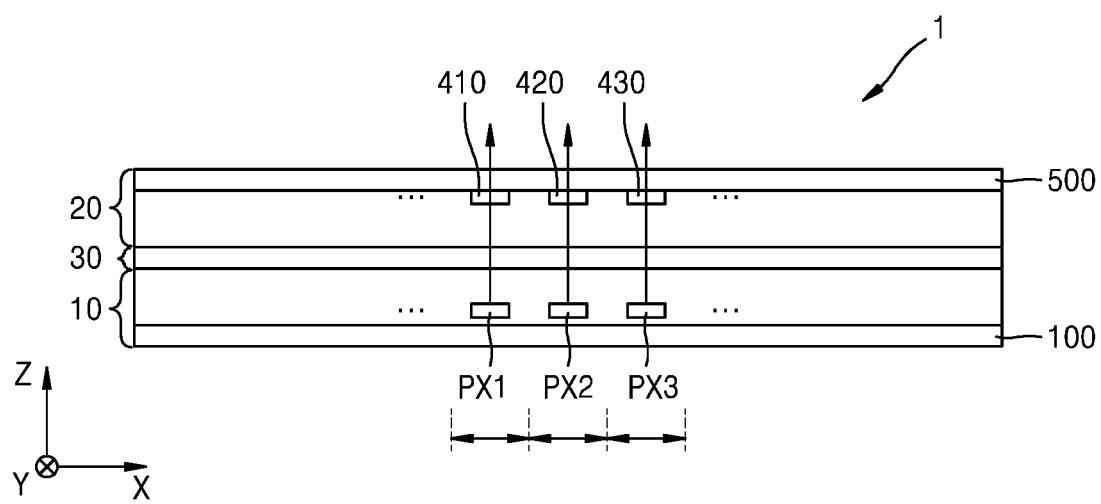
FIG. 3 is a schematic cross-sectional view of the display apparatus of FIG. 1.

FIG. 3 is a schematic cross-sectional view of the display apparatus of FIG. 1.

Referring to FIG. 3, the display apparatus 1 may include a display unit 10 and a color filter unit 20.

The display unit 10 may include a lower substrate 100. First to third pixels PX1 to PX3 may be arranged on the lower substrate 100 of the display unit 10. The first to third pixels PX1 or PX3 may emit light of different colors from each other. For example, the first pixel PX1 may emit light of a first color (for example, blue), the second pixel PX2 may emit light of a second color (for example, green), and the third pixel PX3 may emit light of a third color (for example, red). To this end, the first pixel PX1 may include a first display element, the second pixel PX2 may include a second display element, and the third pixel PX3 may include a third display element. In an embodiment, the first display element may include an emission layer emitting light of the first color, the second display element may include an emission layer emitting light of the second color, and the third display element may include an emission layer emitting light of the third color. In another embodiment, the first to third display elements may each include an emission layer emitting light of the first color, and the light emitted from the first to third pixels PX1 to PX3 may be converted and/or filtered by the color filter unit 20.

The color filter unit 20 may include an upper substrate 500. First to third color filter units 410 to 430 may be disposed on a first surface, which is a lower surface of the upper substrate 500 of the color filter unit 20.

The color filter unit 20 may be manufactured separately from the display unit 10 by forming the first color filter unit 410, the second color filter unit 420, and the third color filter unit 430 on the first surface that is the lower surface of the upper substrate 500. In this case, the direction in which the first surface of the upper substrate 500 faces in an operation of manufacturing the color filter unit 20 is not limited. For example, the color filter unit 20 may be manufactured by forming the first to third color filter units 410, 420, and 430 on the first surface in a state in which the first surface, which is the lower surface of the upper substrate 500, is arranged to face down (to face a −z-axis direction), or may be manufactured by forming the first through third color filter units 410, 420, and 430 on the first surface in a state in which the first surface, which is the lower surface of the upper substrate 500, is arranged to face upward (to face a +z-axis direction).

The display apparatus 1 may be manufactured by bonding the display unit 10 and the color filter unit 20 to each other such that the first to third color filter units 410, 420, and 430 correspond to the first pixel PX1 through the third pixel PX3, respectively. As used herein, "corresponding" means to overlap when viewed from a direction perpendicular to an upper surface of the lower substrate 100 or an upper surface of the upper substrate 500, i.e. the thickness direction "z". The color filter unit 20 may be arranged above the display unit 10. For example, the color filter unit 20 may be arranged such that the first to third color filter units 410 to 430 are disposed above and overlap the first to third display elements of the display unit 10, respectively.

In an embodiment, the display apparatus 1 may further include an adhesive layer 30 disposed between the display unit 10 and the color filter unit 20 and configured to assist the bonding of the display unit 10 and the color filter unit 20. For example, the adhesive layer 30 may include an optical clear adhesive (OCA), but is not limited thereto. In addition, the adhesive layer 30 may include a filler. The filler may be disposed between the display unit 10 and the color filter unit 20 and act as a buffer against external pressure or the like. The filler may include an organic material such as methyl silicone, phenyl silicone, polyimide, or the like, a urethane-based resin, an epoxy-based resin, an acryl-based resin, which are organic sealants, or silicon or the like which is an inorganic sealant, but is not limited thereto. In another embodiment, the adhesive layer 30 may be omitted.

Figure 4:
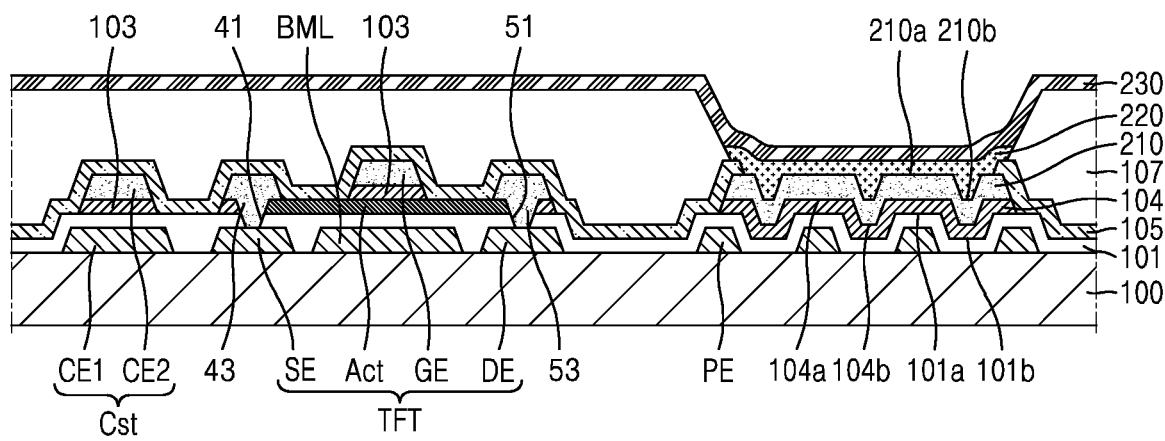
FIG. 4 is a cross-sectional view of an embodiment of one of the pixels of the display unit of FIG. 3 constructed according to the principles of the invention.

FIG. 4 is a cross-sectional view of an embodiment of one of the pixels of the display unit of FIG. 3 constructed according to the principles of the invention.

The display unit 10 (see FIG. 3) may include the lower substrate 100. The lower substrate 100 may include glass, metal, or a polymer resin. In a case where the lower substrate 100 is flexible or bendable, the lower substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. The lower substrate 100 may have a multi-layered structure including two layers each including the polymer resin and a barrier layer arranged therebetween and including an inorganic material (such as silicon oxide, silicon nitride, and silicon oxynitride). However, various modifications may be made. This configuration may also be similarly applied to the upper substrate 500 described below.

The pixel circuit PC (see FIG. 2) and a display element electrically connected to the pixel circuit PC may be disposed on the lower substrate 100.

The pixel circuits PC may be electrically connected to the pixels, respectively. Each of thin-film transistors included in the pixel circuit PC may include a semiconductor layer Act, a gate electrode GE, a source electrode SE, and a drain electrode DE. The thin-film transistor TFT shown in FIG. 4 may be one of the first thin-film transistor T1 and second thin-film transistor T2 of FIG. 2. For example, the first thin-film transistor T1 may include a first semiconductor layer, a first gate electrode, a first source electrode, and a first drain electrode. In addition, the second thin-film transistor T2 may include a second semiconductor layer, a second gate electrode, a second source electrode, and a second drain electrode.

The source electrode SE and the drain electrode DE of the thin-film transistor may be disposed on the lower substrate 100. Each of the source electrode SE and the drain electrode DE may include various conductive layers including molybdenum (Mo), aluminum (Al), copper (Cu), titanium (Ti), or the like, and may include various layered structures. For example, each of the source electrode SE and the drain electrode DE may include a Ti layer and an Al layer, or may include a multi-layered structure of a Ti layer, an Al layer, and another Ti layer. The source electrode SE and the drain electrode DE may be respectively connected to a source area and a drain area of the semiconductor layer Act via contact holes. In addition, in embodiments, each of the source electrode SE and the drain electrode DE may have a multi-layered structure including an indium tin oxide (ITO) layer covering a metal material.

A buffer layer 101 may be disposed on the source electrode SE and the drain electrode DE. The buffer layer 101 may ensure insulation between the source electrode SE and the drain electrode DE of the thin-film transistor TFT and the semiconductor layer Act. The buffer layer 101 may prevent or minimize penetration of impurities or moisture from outside of the lower substrate 100 into the semiconductor layer Act. The buffer layer 101 may include an inorganic material such as silicon oxide, silicon nitride, and/or silicon oxynitride, and may have a single-layered or multi-layered structure. In addition, the buffer layer 101 may extend in the display area DA (see FIG. 1) and the peripheral area PA (see FIG. 1).

The semiconductor layer Act of the thin-film transistor TFT may be disposed on the buffer layer 101 covering the source electrode SE and the drain electrode DE. The semiconductor layer Act may include a channel area, and a source area and a drain area doped with impurities at both sides of the channel area. In this case, the impurities may include N-type impurities or P-type impurities. The semiconductor layer Act may include amorphous silicon or polysilicon. For example, the semiconductor layer Act may include oxide of at least one material selected from the group consisting of indium (In), gallium (Ga), tin (Sn), zirconium (Zr), vanadium (V), hafnium (Hf), cadmium (Cd), germanium (Ge), chromium (Cr), Ti, Al, cesium (Cs), cerium (Ce), and zinc (Zn). The semiconductor layer Act may include a Zn oxide-based material such as Zn oxide, In—Zn oxide, Ga—In—Zn oxide, or the like. The semiconductor layer Act may include an IGZO (In—Ga—Zn—O), ITZO (In—Sn—Zn—O), or IGTZO (In—Ga—Sn—Zn—O) semiconductor containing metal, such as In, Ga, and Sn, in zinc oxide.

The gate electrode GE of the thin-film transistor TFT may be disposed above the semiconductor layer Act to overlap at least a portion of the semiconductor layer Act. For example, the gate electrode GE may overlap the channel area of the semiconductor layer Act. The gate electrode GE may include various conductive materials including Mo, Al, Cu, Ti, or the like, and may have various layered structures. For example, the gate electrode GE may include a Mo layer and an Al layer, or may have a multi-layer structure of a Mo layer, an Al layer, and another Mo layer. Also, in embodiments, the gate electrode GE may have a multi-layered structure including an ITO layer covering a metal material.

In addition, in order to ensure insulation between the semiconductor layer Act and the gate electrode GE of the thin-film transistor TFT, a first inorganic insulating layer 103 may be disposed between the semiconductor layer Act and the gate electrode GE. In other words, the first inorganic insulating layer 103 may be disposed on the semiconductor layer Act, and the gate electrode GE may be disposed on the first inorganic insulating layer 103. The first inorganic insulating layer 103 may include an inorganic material such as silicon oxide, silicon nitride, and/or silicon oxynitride.

In an embodiment, the thin-film transistor TFT may include a source connection electrode 43 and a drain connection electrode 53. The source connection electrode 43 may electrically connect the source electrode SE and the source area of the semiconductor layer Act to each other by contacting an upper surface of the source electrode SE via a source contact hole 41 in the buffer layer 101. The drain connection electrode 53 may electrically connect the drain electrode DE and the drain area of the semiconductor layer Act to each other by contacting an upper surface of the drain electrode DE via a drain contact hole 51 in the buffer layer 101.

The source connection electrode 43 and the drain connection electrode 53 may include the same material as the gate electrode GE. For example, each of the source connection electrode 43 and the drain connection electrode 53 may include various conductive materials including Mo, Al, Cu, Ti, or the like, and may include various layered structures including a multi-layered structure of a Mo layer, an Al layer, and another Mo layer. In addition, in embodiments, each of the source connection electrode 43 and the drain connection electrode 53 may have a multi-layered structure including an ITO layer covering a metal material.

In another embodiment, a bottom metal layer BML at least partially overlapping the semiconductor layer Act of the thin-film transistor TFT may be disposed on the lower substrate 100. The bottom metal layer BML may protect the semiconductor layer Act from external light. The bottom metal layer BML may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W) and/or Cu. In addition, the bottom metal layer BML may have a single-layered or multi-layered structure including the aforementioned materials.

The storage capacitor Cst included in the pixel circuit PC may include a lower electrode CE1 and an upper electrode CE2. The lower electrode CE1 and the upper electrode CE2 may overlap each other with the first inorganic insulating layer 103 therebetween, and form capacitance. In this case, the first inorganic insulating layer 103 may serve as a dielectric layer of the storage capacitor Cst.

In an embodiment, the lower electrode CE1, the source electrode SE, the drain electrode DE, and the bottom metal layer BML may include the same material. For example, each of the lower electrode CE1, the source electrode SE, the drain electrode DE, and the bottom metal layer BML may include various conductive materials including Mo, Al, Cu, Ti, or the like, and may have various layered structures (for example, a multi-layered structure of a Ti layer, an Al layer, and another Ti layer). In this case, the buffer layer 101 may cover the lower electrode CE1, the source electrode SE, the drain electrode DE, and the bottom metal layer BML.

In addition, the upper electrode CE2 and the gate electrode GE of the thin-film transistor TFT may include the same material. For example, the upper electrode CE2 may include various conductive materials including Mo, Al, Cu, Ti, or the like, and may have various layered structures (for example, a multi-layered structure of a Mo layer, an Al layer, and another Mo layer).

Pattern electrodes PE may be disposed on the lower substrate 100 to overlap a display element. The pattern electrodes PE may be spaced apart from each other at certain intervals under the display element, and are electrically isolated from the electrical components of the display apparatus and thus are "dummy" electrodes. The number of pattern electrodes PE and the pattern of pattern electrodes PE are not limited. For example, in FIG. 4, four pattern electrodes PE are arranged as an example, but less than four or more than four pattern electrodes PE may be arranged. In addition, in FIG. 4, the pattern electrodes PE are spaced apart from each other at equal intervals, but the pattern electrodes PE may be arranged at different intervals from each other according to the design. In addition, a width of the pattern electrode PE in a cross-sectional view or an area of the pattern electrode PE in a plan view may be modified in various ways.

In an embodiment, each of the pattern electrodes PE may extend in a direction so as to be substantially parallel to each other in a plan view. In this case, the pattern electrodes PE may have an elongated, such as a stripe shape in a plan view. The function of the pattern electrodes PE is to provide raised configurations to form corresponding recessed and projecting portions in layers formed on top of the pattern electrodes. The recessed and projecting portions may have various shapes based upon the manufacturing process, such as generally convex and generally concave. Thus, for example, when viewed from above in a direction perpendicular to the lower substrate 100, a pixel electrode 210 includes first convex portions 210a and first concave portions 210b, a first additional inorganic insulating layer 104 includes second convex portions 104a and second concave portions 104b, and the buffer layer 101 includes third convex portions 101a and third concave portions 101b of the buffer layer 101. Such recessed and projecting portions formed by the pattern electrodes PE, such as the first convex portions 210a, the first concave portions 210b, the second convex portions 104a, the second concave portions 104b, the third convex portions 101a, the third concave portions 101b, may also have a generally elongated shape such as stripe shape in a plan view.

Accordingly, the pattern electrodes PE may be spaced apart from each other such that elements disposed above the pattern electrodes PE have uneven structures. Here, the "uneven structure" may refer to a structure having projections such as convex portions and recesses such as concave portions between the convex portions. The elements disposed above the pattern electrodes PE may have the uneven structures by continuously covering first areas overlapping the pattern electrodes PE, and second areas disposed between the pattern electrodes PE or between the first areas. In this case, the elements disposed above the pattern electrodes PE may have convex portions in the first areas and concave portions in the second areas.

For example, the buffer layer 101 covering the pattern electrodes PE may have the third convex portions 101a overlapping the pattern electrodes PE and the third concave portions 101b disposed between the third convex portions 101a according to the pattern of the pattern electrodes PE. In addition, the first additional inorganic insulating layer 104 disposed between the buffer layer 101 and the pixel electrode 210 may have the second convex portions 104a overlapping the pattern electrodes PE and the second concave portions 104b disposed between the second convex portions 104a. Thus, the pixel electrode 210 disposed on the first additional inorganic insulating layer 104 may have the first convex portions 210a overlapping the pattern electrodes PE and the first concave portions 210b disposed between the first convex portions 210a. As the pixel electrode 210 has the uneven structure described above, a color shift phenomenon according to a viewing angle may be reduced, and thus, the emission efficiency may be improved.

The pattern electrodes PE may be disposed in the same layer as the source electrode SE, the drain electrode DE, the lower electrode CE1, and the bottom metal layer BML. Accordingly, the pattern electrodes PE may be formed in the same mask process as the source electrode SE, the drain electrode DE, the lower electrode CE1, and the bottom metal layer BML, thereby improving manufacturing process efficiency. In an embodiment, the pattern electrodes PE may be electrically isolated from other conductive patterns and/or layers, such as the source electrode SE, the drain electrode DE, the lower electrode CE1, and the bottom metal layer BML. For example, the pattern electrodes PE may be dummy electrodes to cause the pixel 210 to have the uneven structure. The pattern electrodes PE, the source electrode SE, the drain electrode DE, the lower electrode CE1, and the bottom metal layer BML may include the same material. In addition, the buffer layer 101 may cover the pattern electrodes PE, the source electrode SE, the drain electrode DE, the lower electrode CE1, and the bottom metal layer BML.

A display element disposed above the pattern electrodes PE may be electrically connected to the thin-film transistor TFT of the pixel circuit PC. For example, the pixel electrode 210 included in the display element may be electrically connected to the source electrode SE or the drain electrode DE of the thin-film transistor TFT.

In an embodiment, the display element may be an organic light-emitting element including the pixel electrode 210, an intermediate layer 220 disposed on the pixel electrode 210 and including an emission layer, and an opposite electrode 230 disposed on the intermediate layer 220. In addition, the intermediate layer 220 included in the display element may include a first color emission layer that emits light having a wavelength in a first wavelength band. For example, the first wavelength band may be about 450 nm to about 495 nm, and the first color may be blue, but are not limited thereto.

The pixel electrode 210 may be a (semi-)light-transmitting electrode or a reflective electrode. In some embodiments, the pixel electrode 210 may include a reflective film including Ag, Mg, Al, Pt, Pd, Au, Ni, Nd, Ir, Cr, and any compounds thereof, and a transparent or semi-transparent electrode layer formed on the reflective film. The transparent or semi-transparent electrode layer may include at least one selected from the group consisting of ITO, indium zinc oxide (IZO), zinc oxide (ZnO), indium oxide ($In_2O_3$), indium gallium oxide (IGO), and aluminum zinc oxide (AZO). The pixel electrode 210 may have a stacked structure of an ITO layer, an Ag layer, and another ITO layer.

In an embodiment, the pixel electrode 210 and the gate electrode GE may be formed from the same material. For example, like the pixel electrode 210, the gate electrode GE may be a (semi-)light-transmitting electrode or a reflective electrode, and may have a stacked structure of an ITO layer, an Ag layer, and another ITO layer.

The first additional inorganic insulating layer 104 may be disposed between the pixel electrode 210 and the buffer layer 101. The first additional inorganic insulating layer 104 and the first inorganic insulating layer 103 may be formed from the same material. For example, the first inorganic insulating layer 103 may include an insulating layer including an inorganic material such as silicon oxide, silicon nitride, and/or silicon oxynitride.

A second inorganic insulating layer 105 may be disposed on the source connection electrode 43, the drain connection electrode 53, and the gate electrode GE. The second inorganic insulating layer 105 may cover the source connection electrode 43, the drain connection electrode 53, and the gate electrode GE, and may have an opening exposing and/or overlapping at least a portion of the pixel electrode 210. The second inorganic insulating layer 105 may include an insulating layer including an inorganic material such as silicon oxide, silicon nitride, and/or silicon oxynitride.

Each of the buffer layer 101, the first inorganic insulating layer 103, the first additional inorganic insulating layer 104, and the second inorganic insulating layer 105 including an inorganic material described above may be formed through chemical vapor deposition (CVD) or atomic layer deposition (ALD), but is not limited thereto.

A pixel-defining layer 107 may be disposed on the second inorganic insulating layer 105. The pixel-defining layer 107 may have an opening corresponding to each of the pixels to define a light-emitting area. In this case, the opening in the pixel-defining layer 107 may be formed so that at least part of a central portion of the pixel electrode 210 included in the display element is exposed. Each of the display elements may emit light to the outside via the opening in the second inorganic insulating layer 105 and the opening in the pixel-defining layer 107.

The pixel-defining layer 107 may include one or more organic insulation materials selected from the group consisting of polyamide, polyimide, acrylic resin, benzocyclobutene (BCB), and phenolic resin, and may be formed by a method such as spin coating.

The intermediate layer 220 included in the display element may include a low-molecular weight or polymer material. When the intermediate layer 220 includes a low-molecular-weight material, the intermediate layer 220 may include a structure in which a hole injection layer (HIL), a hole transport layer (HTL), an emission layer (EML), an electron transport layer (ETL), an electron injection layer (ELW), or the like are stacked in a single or complex structure, and may be formed by a method of vacuum deposition. When the intermediate layer 220 includes a polymer material, the intermediate layer 220 may have a structure including the HTL and the EML. In this regard, the HTL may include poly(3,4-ethylenedioxythiophene) (PEDOT), and the EML may include a polymer material such as a polyphenylene vinylene (PPV)-based material, a polyfluorene-based material, or the like. The intermediate layer 220 may be formed by screen printing, inkjet printing, deposition, or laser induced thermal imaging (LITI). However, the intermediate layer 220 is not limited thereto and may have various structures.

The intermediate layer 220 may include an integral layer over a plurality of pixel electrodes 210, but may include layers that are patterned to correspond to the pixel electrodes 210, respectively, according to the particular desired design.

The opposite electrode 230 included in the display element may be disposed on the intermediate layer 220. As an example, the opposite electrode 230 may include an integral layer to cover substantially the entire surface of the display area DA and may be arranged over the display area DA. In other words, the opposite electrode 230 may be integrally formed over a plurality of display elements and correspond to the plurality of pixel electrodes 210. In this case, the opposite electrode 230 may cover the display area DA and extend to part of the peripheral area outside the display area DA. As another example, the opposite electrode 230 may include layers that are patterned to correspond to the plurality of pixel electrodes 210, respectively.

The opposite electrode 230 may be a light-transmitting electrode or a reflective electrode. In some embodiments, the opposite electrode 230 may be a transparent or semi-transparent electrode and may include a metal thin layer having a small work function including lithium (Li), Ca, LiF/Ca, LiF/Al, Ag, Mg, and any compounds thereof. Also, the opposite electrode 230 may further include a transparent conductive oxide (TCO) layer formed of ITO, IZO, ZnO or $In_2O_3$, in addition to the metal thin layer.

Figure 5:
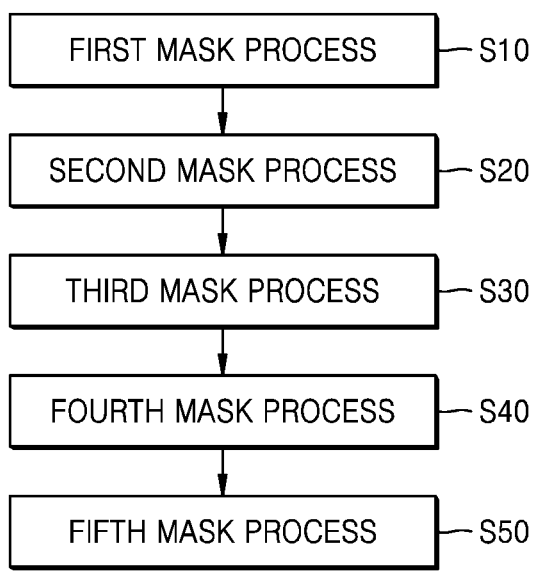
FIG. 5 is a flowchart of an embodiment of a method of manufacturing a display apparatus according to the principles of the invention.

FIG. 5 is a flowchart of an embodiment of a method of manufacturing a display apparatus according to the principles of the invention. FIGS. 6 to 12 are cross-sectional views of one of pixel areas of a display apparatus illustrating some of manufacturing processes of the display apparatus according to the principles of the invention. In the drawings, the same reference numerals denote the same, and thus, repetitive descriptions will be omitted to avoid redundancy.

Referring to FIG. 5, a method of manufacturing a display apparatus may include a first mask process S10, a second mask process S20, a third mask process S30, a fourth mask process S40, and a fifth mask process S50.

Figure 6:
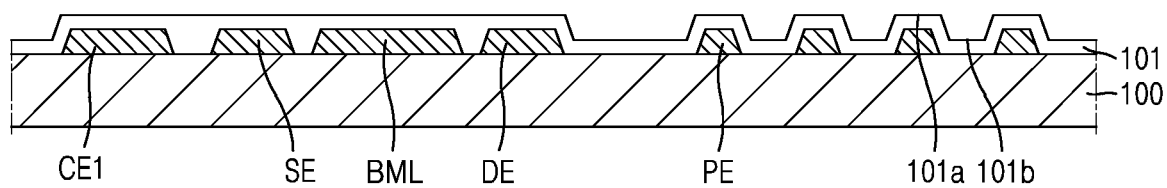
FIGS. 6 to 12 are cross-sectional views of one of pixel areas of a display apparatus illustrating some of manufacturing processes of the display apparatus according to the principles of the invention.

First, as shown in FIG. 6, the first mask process S10 may be performed to form a lower electrode CE1, a source electrode SE, a drain electrode DE, pattern electrodes PE, and a bottom metal layer BML on the lower substrate 100, and the buffer layer 101 may be performed on an output of the first mask process S10.

For example, the first mask process S10 may include processes of forming a first conductive layer on the lower substrate 100, and patterning the first conductive layer to form the lower electrode CE1, the source electrode SE, the drain electrode DE, the pattern electrodes PE, and the bottom metal layer BML. In this case, as described above, the pattern electrodes PE may be spaced apart from each other at certain intervals.

The lower electrode CE1, the source electrode SE, the drain electrode DE, the pattern electrodes PE, and the bottom metal layer BML may include a material included in the first conductive layer, and may thus include the same material as each other. In addition, the lower electrode CE1, the source electrode SE, the drain electrode DE, the pattern electrodes PE, and the bottom metal layer BML may be simultaneously formed in one process, and thus, the efficiency of processes of manufacturing the display apparatus may be improved.

Subsequently, a buffer layer 101 may be formed on substantially the entire surface of the lower substrate 100. The buffer layer 101 may cover the source electrode SE, the drain electrode DE, the pattern electrodes PE, and the bottom metal layer BML. The buffer layer 101 may be formed to have an uneven structure corresponding to the pattern of the pattern electrodes PE in a portion covering the pattern electrodes PE. For example, the buffer layer 101 may include third convex portions 101a overlapping the pattern electrodes PE and third concave portions 101b overlapping spaced areas of the pattern electrodes PE.

Figure 7:
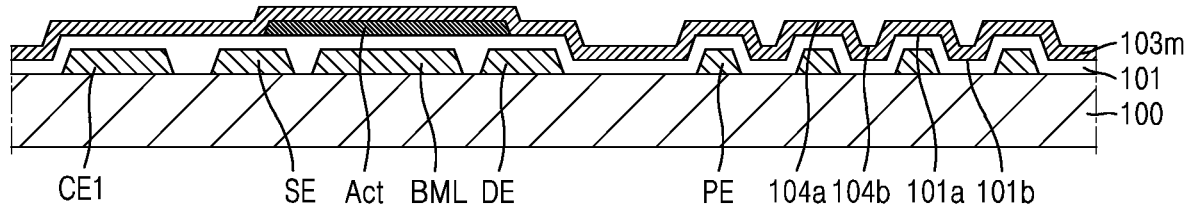

Subsequently, as shown in FIG. 7, the second mask process S20 may be performed to form a semiconductor layer Act, and an inorganic insulation material layer 103m may be formed on an output of the second mask process S20.

For example, the second mask process S20 may include processes of forming a semiconductor material layer on the buffer layer 101, and patterning the semiconductor material layer to form the semiconductor layer Act. In this case, at least part of the semiconductor layer Act described above may overlap the bottom metal layer BML.

Subsequently, the inorganic insulation material layer 103m may be formed on the buffer layer 101 with respect to substantially the entire surface of the lower substrate 100. The inorganic insulation material layer 103m may be patterned to form a first inorganic insulating layer 103 and a first additional inorganic insulating layer 104 in a subsequent process. The inorganic insulation material layer 103m may cover the semiconductor layer Act. In addition, the inorganic insulation material layer 103m may be formed to have an uneven structure corresponding to the pattern of the pattern electrodes PE in a portion covering the pattern electrodes PE. For example, the inorganic insulation material layer 103m may include second convex portions 104a overlapping the pattern electrodes PE and second concave portions 104b overlapping spaced areas of the pattern electrodes PE.

Figure 8:
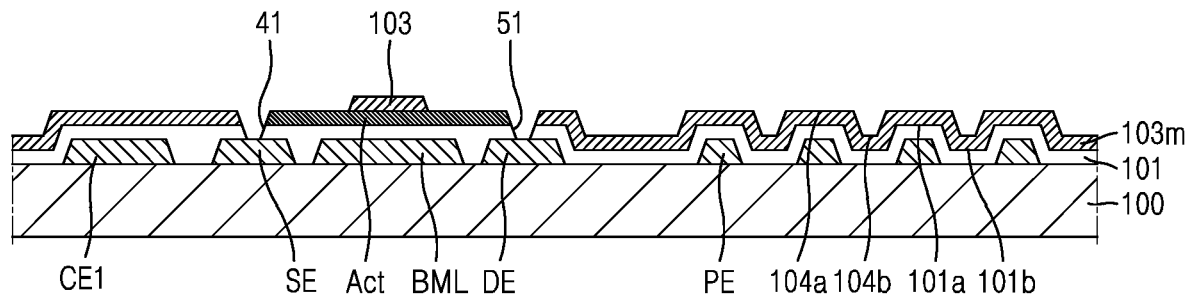

Subsequently, as shown in FIG. 8, the third mask process S30 may be performed to expose portions of the semiconductor layer Act, the source electrode SE, and the drain electrode ED.

For example, the third mask process S30 may include a process of patterning the inorganic insulation material layer 103m and the buffer layer 101 to form the first inorganic insulating layer 103 overlapping at least a portion of the semiconductor layer Act, a source contact hole 41, and a drain contact hole 51. Here, the source contact hole 41 may be a contact hole formed in the buffer layer 101 and exposing an upper surface of the source electrode SE, and the drain contact hole 51 may be a contact hole formed in the buffer layer 101 and exposing an upper surface of the drain electrode DE.

More specifically, the third mask process S30 may include removing the inorganic insulation material layer 103m disposed in an area of the upper surface of the semiconductor layer Act excluding an area in which the first inorganic insulating layer 103 is to be arranged, and an area in which the source contact hole 41 and the drain contact hole 51 are to be formed. In addition, the buffer layer 101 disposed in an area where the source contact hole 41 and the drain contact hole 51 are to be formed may also be removed. In other words, the source contact hole 41 and the drain contact hole 51 may be formed by performing one mask process only, instead of performing a separate mask process on each of the inorganic insulation material layer 103m and the buffer layer 101.

In an embodiment, in the third mask process S30, a photoresist material layer may be formed on substantially the entire surface of the lower substrate 100. Here, the photoresist material layer may be a layer including a photoresist material, which is a material causing a chemical change when light is radiated. For example, the photoresist material layer may include, as a negative-type photoresist, aromatic bisazide, methacrylic acid ester, cinnamic acid ester, or the like, and may include, as a positive-type photoresist, poly(methylmethacrylate), naphthoquinonediazide, polybutene-1-sulfone, or the like, but are not limited thereto.

Subsequently, the photoresist material layer may be patterned to be partially removed in an area of the upper surface of the semiconductor layer Act excluding an area in which the first inorganic insulating layer 103 is to be arranged, and an area in which the source contact hole 41 and the drain contact hole 51 are to be formed. When etching is performed using that state of the photoresist material layer, the inorganic insulation material layer 103m and the buffer layer 101 are partially removed to form the source contact hole 41 and the drain contact hole 51.

In an area overlapping the semiconductor layer Act, the inorganic insulation material layer 103m remains only in an area where the first inorganic insulating layer 103 overlapping at least a portion of the semiconductor layer Act is arranged, and may be removed in the other areas to expose portions of the semiconductor layer Act. The exposed portions of the semiconductor layer Act may be utilized as a source area for electrically connecting the semiconductor layer Act to the source electrode SE and a drain area for electrically connecting the semiconductor layer Act to the drain electrode DE. In other words, the semiconductor layer Act may contact the source connection electrode 43 or the drain connection electrode 53 via the exposed portions provided by removing the inorganic insulation material layer 103m.

However, the buffer layer 101 disposed under the semiconductor layer Act in an area overlapping the semiconductor layer Act may not be removed. In this way, the semiconductor layer Act functions as a mask. To this end, the etching ratio of an etching material used in the third mask process S30 may be controlled. For example, the etching material used in the third mask process S30 may have an etching ratio that is capable of etching the inorganic insulation material layer 103m and the buffer layer 101 but does not affect the semiconductor layer Act.

Figure 9:
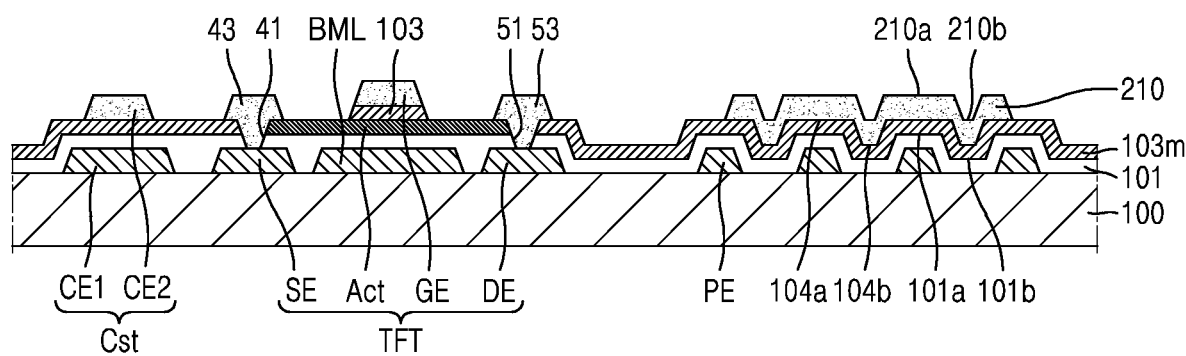

Subsequently, as shown in FIG. 9, the fourth mask process S40 may be performed to form a gate electrode GE, a source connection electrode 43, a drain connection electrode 53, an upper electrode CE2, and a pixel electrode 210.

For example, the fourth mask process S40 may include processes of forming a second conductive layer to cover the inorganic insulation material layer 103m, and patterning the second conductive layer to form the gate electrode GE, the source connection electrode 43, the drain connection electrode 53, the upper electrode CE2, and the pixel electrode 210.

As described above, the source connection electrode 43 may contact an upper surface of the source electrode SE via the source contact hole 41, and electrically connect the source electrode SE and the semiconductor layer Act to each other. In addition, the drain connection electrode 53 may contact an upper surface of the drain electrode DE via the drain contact hole 51, and electrically connect the drain electrode DE and the semiconductor layer Act to each other. In addition, the upper electrode CE2 may be formed above a lower electrode CE1 so as to overlap the lower electrode CE1. In addition, the gate electrode GE may be formed on a first inorganic insulating layer 103 on the semiconductor layer Act so as to overlap at least a portion of the semiconductor layer Act. In addition, the pixel electrode 210 may be formed above the pattern electrodes PE. The pixel electrode 210 may be formed to have an uneven structure corresponding to the pattern of the pattern electrodes PE in a portion covering the pattern electrodes PE. For example, the pixel electrode 210 may include first convex portions 210a overlapping the pattern electrodes PE and first concave portions 210b overlapping spaced areas of the pattern electrodes PE.

All of the gate electrode GE, the source connection electrode 43, the drain connection electrode 53, the upper electrode CE2, and the pixel electrode 210 may be formed from material included in the second conductive layer, and may be the same material. In addition, the gate electrode GE, the source connection electrode 43, the drain connection electrode 53, the upper electrode CE2, and the pixel electrode 210 may be simultaneously formed in one process, and thus, the efficiency of processes of manufacturing the display apparatus may be improved.

Figure 10:
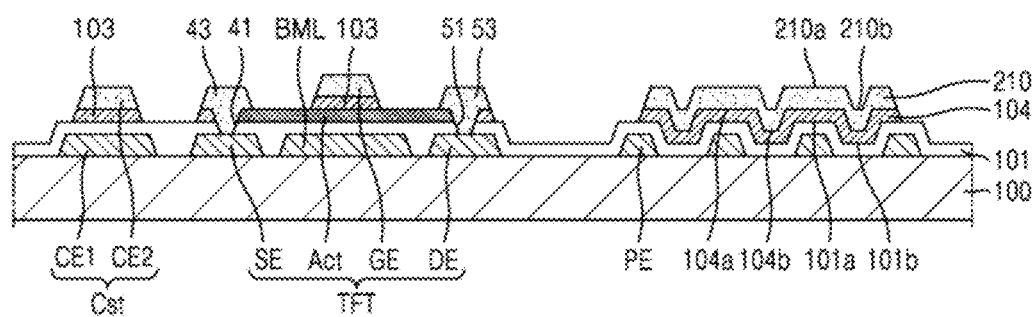

Subsequently, the gate electrode GE, the source connection electrode 43, the drain connection electrode 53, the semiconductor layer Act, the upper electrode CE2, and the pixel electrode 210 may be used as a mask to pattern the inorganic insulation material layer 103*m* to be disposed only in areas overlapping the gate electrode GE, the source connection electrode 43, the drain connection electrode 53, the semiconductor layer Act, the upper electrode CE2, and the pixel electrode 210 as shown in FIG. 10.

Figure 11:
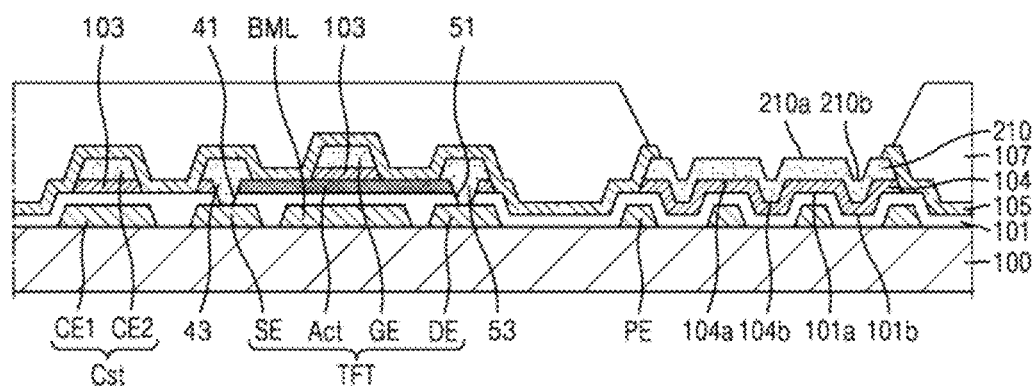

Subsequently, as shown in FIG. 11, the fifth mask process S50 may be performed to form a second inorganic insulating layer 105 and a pixel-defining layer 107.

For example, the fifth mask process S50 may include processes of forming the second inorganic insulating layer 105 and the pixel-defining layer 107 to cover the gate electrode GE, the source connection electrode 43, the drain connection electrode 53, the upper electrode CE2, and the pixel electrode 210, and forming an opening exposing at least a portion of the pixel electrode 210 in the second inorganic insulating layer 105 and the pixel-defining layer 107.

Figure 12:
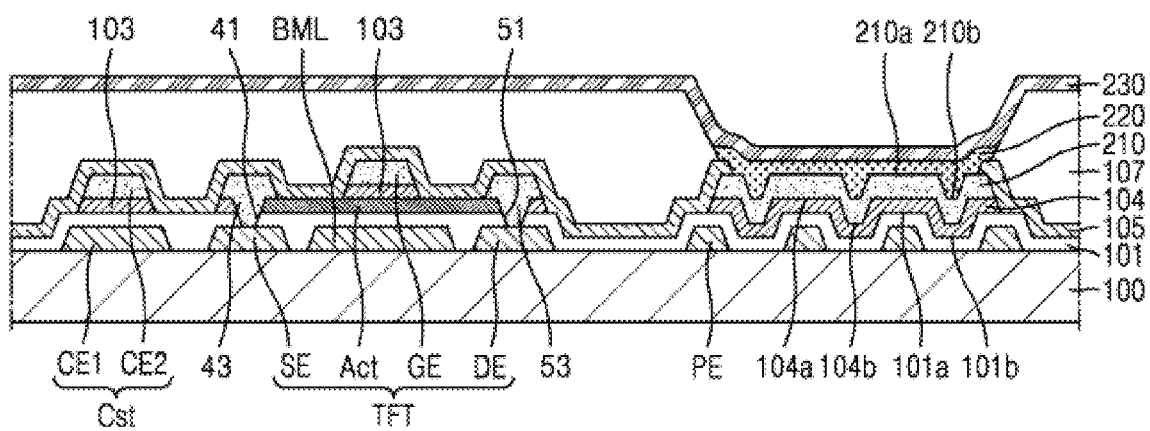

Subsequently, as shown in FIG. 12, an intermediate layer 220 including an emission layer may be formed on the pixel electrode 210, and an opposite electrode 230 may be formed on the intermediate layer 220. In addition, an encapsulation layer 300 (see FIG. 13) for protecting a display element and/or the emission layer may be formed on the opposite electrode 230.

Figure 13:
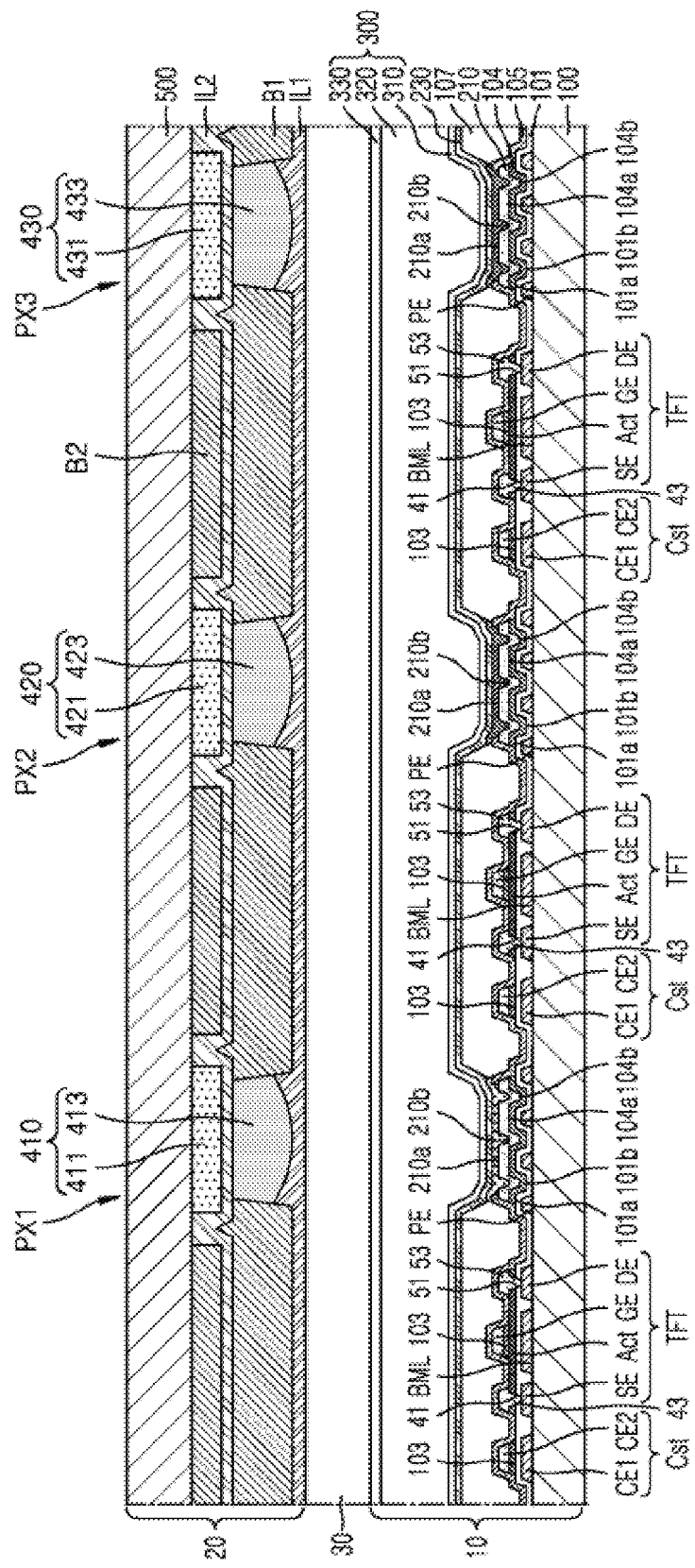
FIG. 13 is a cross-sectional view taken along line A-A' of FIG. 1 according to an embodiment.

FIG. 13 is a cross-sectional view taken along line A-A' of FIG. 1 according to an embodiment.

Referring to FIGS. 1 and 13, the first to third pixels PX1 to PX3 are adjacent to one another, but embodiments are not limited thereto. For example, elements such as other lines may be disposed between the first to third pixels PX1 to PX3. In addition, the first pixel PX1 and the second pixel PX2 may not be adjacent to each other. In addition, the cross-sections of the first pixel PX1 through the third pixel PX3 in FIG. 4 may not be cross-sections in the same direction.

The display unit 10 described above with reference to FIGS. 4 to 12 may further include an encapsulation layer 300.

Because a display element such as an organic light-emitting diode may be easily damaged by moisture or oxygen or the like from the outside, the display element may be covered and protected by the encapsulation layer 300. The encapsulation layer 300 may include at least one organic encapsulation layer and at least one inorganic encapsulation layer. For example, the encapsulation layer 300 may include a first inorganic encapsulation layer 310, an organic encapsulation layer 320, and a second inorganic encapsulation layer 330.

The first inorganic encapsulation layer 310 may cover the opposite electrode 230 and may include silicon oxide, silicon nitride, silicon oxynitride, and/or the like. Other layers such as a capping layer or the like may be disposed between the first inorganic encapsulation layer 310 and the opposite electrode 230. Because the first inorganic encapsulation layer 310 is formed along a lower structure thereof, an upper surface of the first inorganic encapsulation layer 310 is not flat, and thus, the organic encapsulation layer 320 covers the first inorganic encapsulation layer 310 to have a flat upper surface. The organic encapsulation layer 320 may include one or more materials selected from a group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 330 may cover the organic encapsulation layer 320 and may include silicon oxide, silicon nitride, silicon oxynitride, silicon oxynitride, or the like.

According to the above-stated multi-layer structure, even when cracks occur in the encapsulation layer 300, the encapsulation layer 300 may prevent the cracks from connecting and/or being propagated between the first inorganic encapsulation layer 310 and the organic encapsulation layer 320 or between the organic encapsulation layer 320 and the second inorganic encapsulation layer 330. Accordingly, the formation of a path, through which external moisture, oxygen, or the like may penetrate, may be prevented or minimized.

The color filter unit 20 may be disposed above the display unit 10.

The color filter unit 20 may include the upper substrate 500. First to third color filter units 410 to 430 that correspond to the first to third pixels PX1 to PX3, respectively, may be disposed on a first surface of the upper substrate 500. In this case, the "first surface" refers to a surface (a lower surface) facing the display unit 10 when the color filter unit 20 is arranged above the display unit 10. The first to third color filter units 410 to 430 may overlap emission layers of the first to third display elements, respectively, when viewing in a direction perpendicular to the lower substrate 100 of the display unit 10 or the upper substrate 500 of the color filter unit 20. Thus, the first to third color filter units 410 to 430 may filter light emitted from the first to third display elements, respectively.

The first color filter unit 410, the second color filter unit 420, and the third color filter unit 430 may respectively include a first-color color filter unit 411, a second-color color filter unit 421, and a third-color color filter unit 431 disposed on the first surface that is a lower surface of the upper substrate 500, and may respectively include a light-transmitting layer 413 disposed on the first-color color filter layer 411, a second color quantum dot layer 423 disposed on the second-color color filter layer 421, and a third color quantum dot layer 433 disposed on the third-color color filter layer 431.

For example, the first color filter unit 410 may include the first-color color filter layer 411 and the light-transmitting layer 413, the second color filter unit 420 may include the second-color color filter layer 421 and the second color quantum dot layer 423, and the third color filter unit 430 may include the third-color color filter layer 431 and the third color quantum dot layer 433. In addition, first partition walls B1 may be arranged between the light-transmitting layer 413, the second color quantum dot layer 423, and the third color quantum dot layer 433, and second partition walls B2 may be arranged between the first-color color filter layer 411, the second-color color filter unit 421, and the third-color color filter layer 431.

The first-color color filter layer 411 may only allow light having a wavelength in about 450 nm to about 495 nm to pass through, the second-color color filter layer 421 may only allow light having a wavelength in about 495 nm to about 570 nm to pass through, and the third-color color filter layer 431 may only allow light having a wavelength in about 630 nm to about 780 nm to pass through. The first-color color filter layer 411 through the third-color color filter layer 431 may reduce external light reflection in a display apparatus.

For example, when external light reaches the first-color color filter layer 411, only light having a preset range of wavelengths described above passes through the first-color color filter layer 411, and light of other wavelengths is absorbed by the first-color color filter layer 411. Thus, only light having the preset range of wavelengths described above among the external light incident onto the display apparatus may pass through the first-color color filter layer 411, and a portion of the light passing through the first-color color filter layer 411 may be reflected by the opposite electrode 230 or the first pixel electrode of the first display element thereunder and transmitted to the outside again. As a result, because only the portion of external light incident onto the first pixel PX1 is reflected to the outside, the first-color color filter layer 411 may reduce the external light reflection. The above descriptions may be applied to the second-color color filter layer 421 and the third-color color filter layer 431 in the same way.

The second color quantum dot layer 423 may convert light having a wavelength in a first wavelength band generated in the intermediate layer 220 of the second display element into light having a wavelength in a second wavelength band. For example, when light having a wavelength in about 450 nm to about 495 nm is generated in the intermediate layer 220 of the second display element, the second color quantum dot layer 423 may convert the light into light having a wavelength in about 495 nm to about 570 nm. Accordingly, the light having a wavelength in about 495 nm to about 570 nm may be emitted from the second pixel PX2 to the outside.

The third color quantum dot layer 433 may convert light having a wavelength in the first wavelength band generated in the intermediate layer 220 of the third display element into light having a wavelength in a third wavelength band. For example, when light having a wavelength in about 450 nm to about 495 nm is generated in the intermediate layer 220 of the third display element, the third color quantum dot layer 433 may convert the light into light having a wavelength in about 630 nm to about 780 nm. Accordingly, the light having a wavelength in about 630 nm to about 780 nm may be emitted from the third pixel PX3 to the outside.

Each of the second color quantum dot layer 423 and the third color quantum dot layer 433 may have a form in which quantum dots are dispersed in a resin.

The size of the quantum dots may be several nanometers, and the wavelength of light after conversion may be changed according to the particle size of the quantum dots. In other words, the quantum dots may control the color of light emitted according to the particle size of the quantum dots, and accordingly, the quantum dots may have various emission colors such as blue, red, green, or the like. The particle size of the quantum dots may have a full width of half maximum (FWHM) of an emission wavelength spectrum of about 45 nm or less, for example, about 40 nm or less, and for example, about 30 nm or less. Color purity and color reproducibility may be improved in the above range. In addition, as light emitted through the quantum dots is emitted in all directions, the viewing angle of light may be improved. In addition, the form of the quantum dots may be one that is generally used in the art and is not particularly limited, and more particularly, the form of the quantum dots may include a sphere shape, a pyramid shape, a multi-arm shape, or cubic nanoparticles, nanotubes, nanowires, nanofibers, nanoplatelets, or the like. In addition, the quantum dots may include a semiconductor material such as cadmium sulfide (CdS), cadmium telluride (CdTe), zinc sulfide (AnS), indium phosphide (InP), or the like.

The resin included in the second color quantum dot layer 423 and the third color quantum dot layer 433 may be any material as long as being a light-transmitting material. For example, a polymer resin such as a silicone resin, an epoxy resin, acrylic, BCB, HMDSO, or the like may be used as materials forming the second color quantum dot layer 423 and the third color quantum dot layer 433.

The first color filter unit 410 may not include a quantum dot layer, and may include the light-transmitting layer 413. For example, the display unit 10 may include an intermediate layer 220 disposed between the first through third pixel electrodes and the opposite electrode and including a first color emission layer emitting light having a wavelength in the first wavelength band. In this case, light having the wavelength in the first wavelength band generated in the intermediate layer 220 may be emitted from the first pixel PX1 to the outside without wavelength conversion. Accordingly, because a quantum dot layer is not needed in the first pixel PX1, the first color filter unit 410 may include the light-transmitting layer 413 including a light-transmitting resin instead of the quantum dot layer. For example, the light-transmitting layer 413 may include a polymer resin such as a silicone resin, an epoxy resin, acrylic, BCB, HMDSO, or the like.

Applicants realized that preventing the second color quantum dot layer 423 and the third color quantum dot layer 433 from being damaged in a manufacturing operation or a use operation after the manufacturing operation is required. To this end, the color filter unit 20 may further include a second protective layer IL2 arranged between the first-color color filter layer 411 and the light-transmitting layer 413 and covering an upper surface of the second color quantum dot layer 423 and an upper surface of the third color quantum dot layer 433. In other words, the second protective layer IL2 may be arranged between the first-color color filter layer 411 and the light-transmitting layer 413 and cover a surface of the second color quantum dot layer 423 facing the second-color color filter layer 421 and a surface of the third color quantum dot layer 433 facing the third-color color filter layer 431.

For example, it is necessary to prevent outgas generated in the second color filter layer 421 from damaging quantum dots in the second color quantum dot layer 423 and causing the quantum dots to fail to convert light in a first wavelength band into light in a second wavelength band. Likewise, it is necessary to prevent outgas generated in the third color filter layer 431 from damaging quantum dots in the third color quantum dot layer 433 and causing the quantum dots to fail to convert light in the first wavelength band into light in the third wavelength band. To this end, a second protective layer IL2 may be arranged between the second-color color filter layer 421 and the second color quantum dot layer 423, and may also be arranged between the third-color color filter layer 431 and the third color quantum dot layer 433. Also, the second protective layer IL2 may be integral over substantially the entire surface of the upper substrate 500.

The second protective layer IL2 may include an inorganic material such as silicon oxide, silicon nitride, or silicon oxynitride to block gas passage. In addition, the second protective layer IL2 may include an organic material including one or more materials selected from the group consisting of polyethylene terephthalate, polyethylene naphthalate, polycarbonate, polyimide, polyethylene sulfonate, polyoxymethylene, polyarylate, and HMDSO.

In addition, the first protective layer TL1 may cover the light-transmitting layer 413, the second-color quantum dot layer 423, and the third-color quantum dot layer 433. The first protective layer TL1 may include a material such as silicon oxide, silicon nitride, silicon oxynitride, or the like, as an inorganic insulating material having light transmittance.

In the display apparatus of the illustrated embodiment, light in the first wavelength band is externally emitted in the first pixel PX1, light in the second wavelength band is externally emitted in the second pixel PX2, and light in the third wavelength band is externally emitted in the third pixel PX3. Accordingly, the display apparatus may display a full color image.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate;
   a source electrode, a drain electrode, and first electrodes disposed on the substrate and spaced apart from each other;
   a first layer covering the source electrode, the drain electrode, and the first electrodes;
   a semiconductor layer disposed on the first layer;
   a source connection electrode contacting the source electrode through a first hole in the first layer to electrically connect the source electrode and the semiconductor layer to each other;
   a drain connection electrode contacting the drain electrode through a second hole in the first layer to electrically connect the drain electrode and the semiconductor layer to each other; and
   a pixel electrode disposed above the first layer and overlapping the first electrodes including first projections overlapping the first electrodes and first recesses between the first projections.

2. The display apparatus of claim 1, wherein the first layer comprises third projections overlapping the first electrodes and third recesses between the third projections.

3. The display apparatus of claim 1, further comprising:
   a first inorganic insulating layer disposed on the semiconductor layer; and
   a gate electrode disposed on the first inorganic insulating layer.

4. The display apparatus of claim 3, further comprising a first additional inorganic insulating layer disposed between the first layer and the pixel electrode and including second projections overlapping the first electrodes and second recesses between the second projections.

5. The display apparatus of claim 4, wherein the first inorganic insulating layer and the first additional inorganic insulating layer comprises a same material, the first layer comprises a buffer layer, the first electrodes comprise pattern electrodes, the first and second projections comprises first and second convex portions, and the first and second recesses comprise first and second concave portions.

6. The display apparatus of claim 3, wherein the pixel electrode and the gate electrode comprise a same material.

7. The display apparatus of claim 3, wherein the source connection electrode, the drain connection electrode, and the gate electrode comprise a same material.

8. The display apparatus of claim 3, further comprising a second inorganic insulating layer covering the source connection electrode, the drain connection electrode, and the gate electrode, and including an opening that exposes at least a portion of the pixel electrode.

9. The display apparatus of claim 1, wherein the first electrodes, the source electrode, and the drain electrode are disposed in a same layer and comprise a same material.

10. The display apparatus of claim 1, further comprising a bottom metal layer disposed on the substrate and overlapping the semiconductor layer.

11. The display apparatus of claim 10, wherein the bottom metal layer, the source electrode, the drain electrode, and the first electrodes comprise a same material.

12. The display apparatus of claim 11, wherein the first layer covers the bottom metal layer, the source electrode, the drain electrode, and the first electrodes.

13. The display apparatus of claim 1, further comprising:
    an intermediate layer disposed on the pixel electrode and including an emission layer; and
    an opposite electrode disposed on the intermediate layer.

14. A method of manufacturing a display apparatus, the method comprising steps of:
    forming a first conductive layer on a substrate;
    patterning the first conductive layer to form a source electrode, a drain electrode, and first electrodes;
    forming a first layer that covers the source electrode, the drain electrode, and the first electrodes;
    forming a semiconductor layer on the first layer;
    forming a first inorganic insulating layer that covers the first layer and at least a portion of the semiconductor layer;
    forming, in the first layer and the first inorganic insulating layer, a first hole that exposes an upper surface of the source electrode and a second hole that exposes an upper surface of the drain electrode;
    forming a second conductive layer to cover the first inorganic insulating layer;
    patterning the second conductive layer to form a gate electrode overlapping the semiconductor layer, a source connection electrode overlapping the first hole, a drain connection electrode overlapping the second hole, and a pixel electrode overlapping the first electrodes;
    sequentially forming a second inorganic insulating layer and a pixel-defining layer to cover the gate electrode, the source connection electrode, the drain connection electrode, and the pixel electrode; and
    forming, in the second inorganic insulating layer and the pixel-defining layer, an opening that exposes at least a portion of the pixel electrode,
    wherein:
    the first electrodes comprise pattern electrodes spaced apart from each other on the substrate; and
    the pixel electrode comprises first projections overlapping the pattern electrodes and first recesses between the first projections.

15. The method of claim 14, wherein
    the first layer comprises third projections overlapping the pattern electrodes and third recesses between the third projections.

16. The method of claim 14, wherein the source connection electrode contacts the source electrode through the first hole in the first layer to electrically connect the source electrode and the semiconductor layer to each other, and the drain connection electrode contacts the drain electrode through the second hole in the first layer to electrically connect the drain electrode and the semiconductor layer to each other.

17. The method of claim 14, wherein the step of patterning the first conductive layer comprises patterning the first conductive layer to form a bottom metal layer, the source electrode, the drain electrode, and the first electrodes, wherein the step of forming the semiconductor layer on the first layer comprises forming the semiconductor layer to overlap the bottom metal layer.

18. The method of claim 17, wherein the first layer covers the bottom metal layer, the source electrode, the drain electrode, and the first electrodes.

19. The method of claim 14, further comprising steps of:

forming an intermediate layer including an emission layer on the pixel electrode; and forming an opposite electrode on the intermediate layer.

\* \* \* \* \*